(12) United States Patent
Heo et al.

(10) Patent No.: US 10,861,735 B2
(45) Date of Patent: Dec. 8, 2020

(54) SUBSTRATE SUPPORT UNIT

(71) Applicant: SEMIgear, Inc., Wakefield, MA (US)

(72) Inventors: Yonghoe Heo, Pyeongtaek-si (KR); Donghee Lee, Bucheon-si (KR)

(73) Assignee: SEMIgear, Inc., Wakefield, MA (US)

( * ) Notice: Subject to any disclaimer, the term of this patent is extended or adjusted under 35 U.S.C. 154(b) by 0 days.

(21) Appl. No.: 16/387,502

(22) Filed: Apr. 17, 2019

(65) Prior Publication Data
US 2019/0333800 A1   Oct. 31, 2019

(30) Foreign Application Priority Data
Apr. 30, 2018 (KR) .................. 10-2018-0049743

(51) Int. Cl.
| | | |
|---|---|---|
| H01L 21/683 | (2006.01) | |
| H01L 21/67 | (2006.01) | |
| B23B 31/30 | (2006.01) | |

(52) U.S. Cl.
CPC .... *H01L 21/6838* (2013.01); *H01L 21/67253* (2013.01); *H01L 21/67288* (2013.01); *B23B 31/307* (2013.01); *Y10T 279/11* (2015.01)

(58) Field of Classification Search
CPC ........... H01L 21/6838; H01L 21/67253; H01L 21/67288; B23B 31/307; Y10T 279/11
See application file for complete search history.

(56) References Cited

U.S. PATENT DOCUMENTS

| | | | | |
|---|---|---|---|---|
| 5,191,218 A | * | 3/1993 | Mori | G03F 7/707 250/453.11 |
| 5,534,073 A | * | 7/1996 | Kinoshita | B25B 11/005 118/728 |
| 5,564,682 A | * | 10/1996 | Tsuji | B25B 11/005 269/21 |
| 7,214,548 B2 | * | 5/2007 | Fayaz | H01L 21/67288 438/4 |
| 9,343,349 B2 | * | 5/2016 | Iwashita | B23Q 3/088 |
| 10,199,255 B2 | * | 2/2019 | Muri | B23C 3/13 |
| 10,495,668 B2 | * | 12/2019 | Noguchi | G01R 1/0408 |
| 10,586,727 B2 | * | 3/2020 | Matsui | H01L 21/6875 |

(Continued)

FOREIGN PATENT DOCUMENTS

| | | |
|---|---|---|
| JP | 2003-037088 A | 2/2003 |
| KR | 10-2007-0043482 A | 4/2007 |

(Continued)

*Primary Examiner* — Eric A. Gates
*Assistant Examiner* — Chwen-Wei Su
(74) *Attorney, Agent, or Firm* — Park, Kim & Suh, LLC

(57) ABSTRACT

Disclosed is an apparatus for supporting a substrate. The substrate support unit includes a support plate having a plurality of absorption holes, in which a vacuum pressure is formed, on an upper surface thereof to absorb the substrate, and a vacuum absorption unit configured to apply the vacuum pressure to the absorption holes, and the vacuum absorption unit includes a pressure measuring member configured to measure internal pressures of the absorption holes, an intake unit configured to intake and discharge gas in the absorption holes and adjust a suction force for suctioning the gas in the absorption holes, and a controller configured to control the intake unit to adjust the suction force according to the internal pressures measured by the pressure measuring member.

6 Claims, 9 Drawing Sheets

(56) References Cited

U.S. PATENT DOCUMENTS

| | | | |
|---|---|---|---|
| 2018/0286772 A1* | 10/2018 | Yamamoto | B23B 31/307 |
| 2019/0043749 A1* | 2/2019 | Jeunink | B25B 11/005 |
| 2020/0006096 A1* | 1/2020 | Imamura | H01L 21/6838 |

FOREIGN PATENT DOCUMENTS

| | | |
|---|---|---|
| KR | 10-2009-0121464 A | 11/2009 |
| KR | 10-1049444 B1 | 7/2011 |
| KR | 10-1770221 B1 | 8/2017 |
| TW | 200714951 A | 4/2007 |
| TW | 201036099 A | 10/2010 |

\* cited by examiner

SUBSTRATE SUPPORT UNIT

CROSS-REFERENCE TO RELATED APPLICATIONS

The present application claims the benefit of Korean Patent Application No. 10-2018-0049743 filed on Apr. 30, 2018, in the Korean Intellectual Property Office, the entire contents of which are hereby incorporated by reference.

BACKGROUND

Embodiments of the inventive concept described herein relate to an apparatus for supporting a substrate.

A semiconductor integrated circuit generally is a very small and thin silicon chip but includes various electronic parts, and various manufacturing processes including a photographing process, an etching process, and a deposition process to manufacture one semiconductor chip.

The apparatus for performing the semiconductor manufacturing process includes a chuck at a lower end of the interior of a chamber to support a substrate, such as a semiconductor wafer. The chuck fixes a wafer to an upper surface thereof by using mechanical clamping, an electrostatic force, or vacuum absorption.

The chuck using mechanical clamping fixes a wafer by pressing a support surface of the wafer by using an arm or a clamp, the chuck using an electrostatic force fixes a wafer by generating a static electricity absorbing force between a wafer and a chuck, and the chuck of a vacuum absorption scheme has a vacuum hole, to which a vacuum pressure is applied, on an upper surface thereof and absorbs a wafer by using the vacuum pressure formed in the vacuum hole.

Further, a warpage of a wafer causes a gap between the wafer and the upper surface of the chuck having the vacuum hole when the wafer is positioned on the chuck of the vacuum absorption scheme, making it difficult to fix the wafer to the chuck, making it difficult to grip the wafer by a transfer unit when the wafer is transferred, and making it difficult to uniformly heat or cool the wafer due to the uneven distances of the areas from the heating or cooling configuration when the wafer is heated or cooled.

SUMMARY

Embodiments of the inventive concept provide a substrate support unit that may stably fix a substrate having a warpage.

Embodiments of the inventive concept also provide a substrate support unit that may prevent and improve a warpage of a substrate.

The technical objects of the inventive concept are not limited to the above-mentioned ones, and the other unmentioned technical objects will become apparent to those skilled in the art from the following description.

The inventive concept provides a substrate support unit for supporting a substrate. The substrate support unit includes a support plate having a plurality of absorption holes, in which a vacuum pressure is formed, on an upper surface thereof to absorb the substrate, and a vacuum absorption unit configured to apply the vacuum pressure to the absorption holes, and the vacuum absorption unit includes a pressure measuring member configured to measure internal pressures of the absorption holes, an intake unit configured to intake and discharge gas in the absorption holes and adjust a suction force for suctioning the gas in the absorption holes, and a controller configured to control the intake unit to adjust the suction force according to the internal pressures measured by the pressure measuring member.

The controller may control the intake unit to increase a suction force for some of the absorption holes, an internal pressure of which is a specific value or more, in a state in which the gas in the suction hole is discharged to absorb the substrate.

A groove that is recessed inwards from the upper surface of the support plate may be formed on the upper surface of the support plate, and some or all of the absorption holes may be located in the interior of the groove.

The groove may have an arc shape, a lengthwise direction of which extends along a circumferential direction of the support plate when viewed from the top.

The groove may have a circular shape that is concentric to a circumference of the support plate when viewed from the top.

The support plate may include an upper support plate having a absorption hole and the groove on the upper surface thereof, and a lower support plate provided below the upper support plate and configured to support the upper support plate, and the upper support plate may be replaceable.

The upper support plate may include a first upper support plate and a second upper support plate that are replaceable with each other, and the shapes of the grooves of the first upper support plate and the second upper support plate may be different when viewed from the top.

The absorption holes may include a first absorption hole formed in a central area of the support plate, and a second absorption hole formed in a peripheral area of the support plate, and the controller may control the intake unit to increase a suction force of one of the first absorption hole and the second absorption hole, an internal pressure of which is a specific value or more.

The absorption holes may further include a third absorption hole formed in an area between a central area of the support plate and a peripheral area of the support plate, and the controller may control the intake unit to increase a suction force of one of the first absorption hole, the second absorption hole, and the third absorption hole, an internal pressure of which is a specific value or more.

The intake unit may include a pump configured to generate a suction force, connection lines connecting the pump and the absorption holes, and valves configured to adjust opening degrees of the connection lines, and the controller may control the intake unit to adjust the suction force by adjusting the opening degrees of the valves.

The absorption holes may include a first absorption hole formed in a central area of the support plate, and a second absorption hole formed in a peripheral area of the support plate, the connection lines may include a first connection line connecting the first absorption hole and the pump, and a second connection line connecting the second absorption hole and the pump, the valves may include a first valve configured to adjust an opening degree of the first connection line, and a second valve configured to adjust an opening degree of the second connection line, and the controller may control the intake unit to adjust the suction force by adjusting opening degrees of the first valve and the second valve.

The absorption holes may further include a third absorption hole formed in an area between a central area of the support plate and a peripheral area of the support plate, the connection lines may further include a third connection line connecting the third absorption hole and the pump, the valves may further include a third valve configured to adjust an opening degree of the third connection line, and the controller may control the intake unit to adjust the suction force by adjusting an opening degree of the third valve.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

A substrate support unit 10 according to an embodiment of the inventive concept supports a substrate in a substrate treating apparatus that performs a process of treating a substrate. The substrate support unit 10 may be provided in various types of substrate treating apparatuses. For example, the substrate treating apparatus may be provided as an apparatus for performing one of processes for treating a substrate, such as a photographing process, an etching process, and a deposition process. The substrate of the inventive concept may be a wafer, a mask, or a liquid crystal display (LCD) panel.

Figure 1:
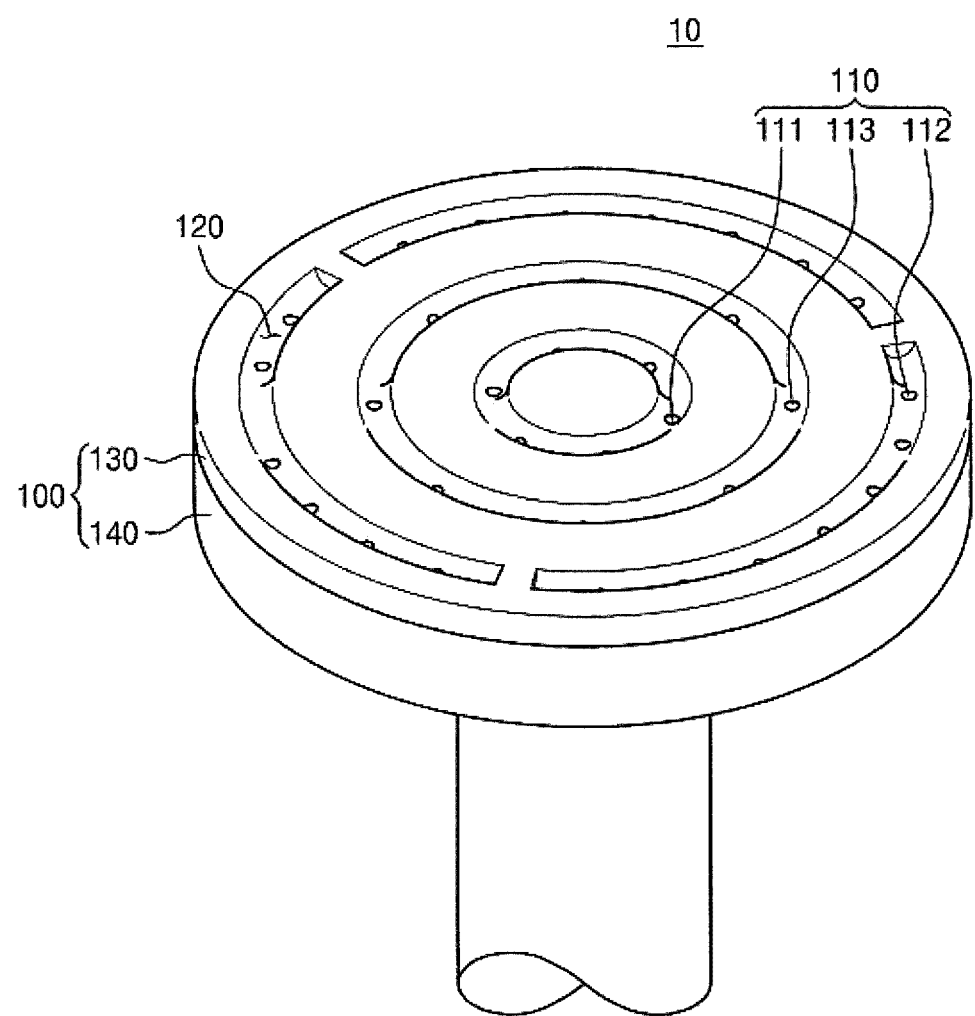
FIG. 1 is a schematic perspective view of a substrate support unit according to an embodiment of the inventive concept.
Figure 2:
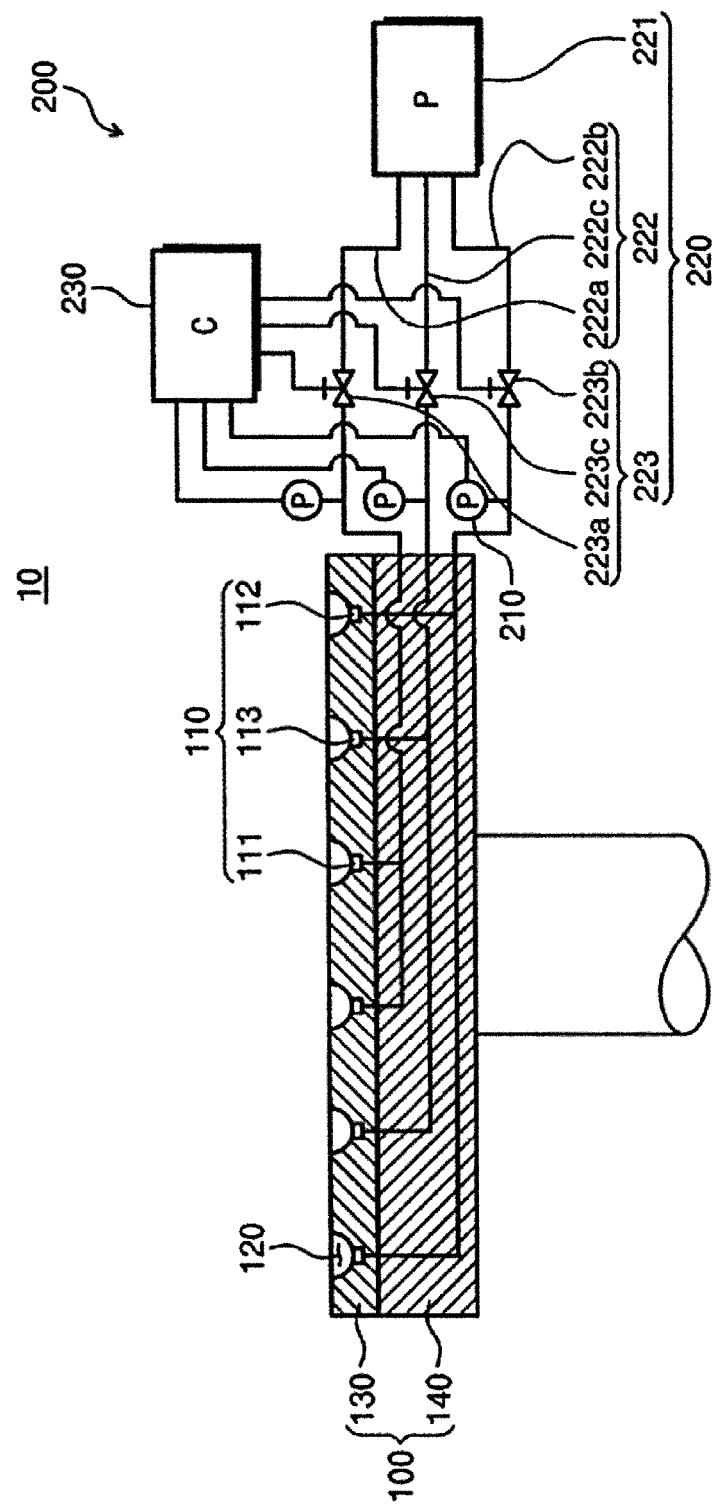
FIG. 2 is a side sectional view of a substrate support unit of FIG. 1.

FIG. 1 is a schematic perspective view of a substrate support unit 10 according to an embodiment of the inventive concept. FIG. 2 is a side sectional view of a substrate support unit 10 of FIG. 1. Referring to FIGS. 1 and 2, according to an embodiment, the substrate support unit 10 includes a support plate 100 and a vacuum absorption unit 200.

The substrate S is positioned on an upper surface of the support plate 100. A plurality of absorption holes 110 are formed on the upper surface of the support plate 100. A vacuum pressure is formed in the absorption hole 110 to absorb the substrate S positioned on the upper surface of the support plate 100.

Figure 3:
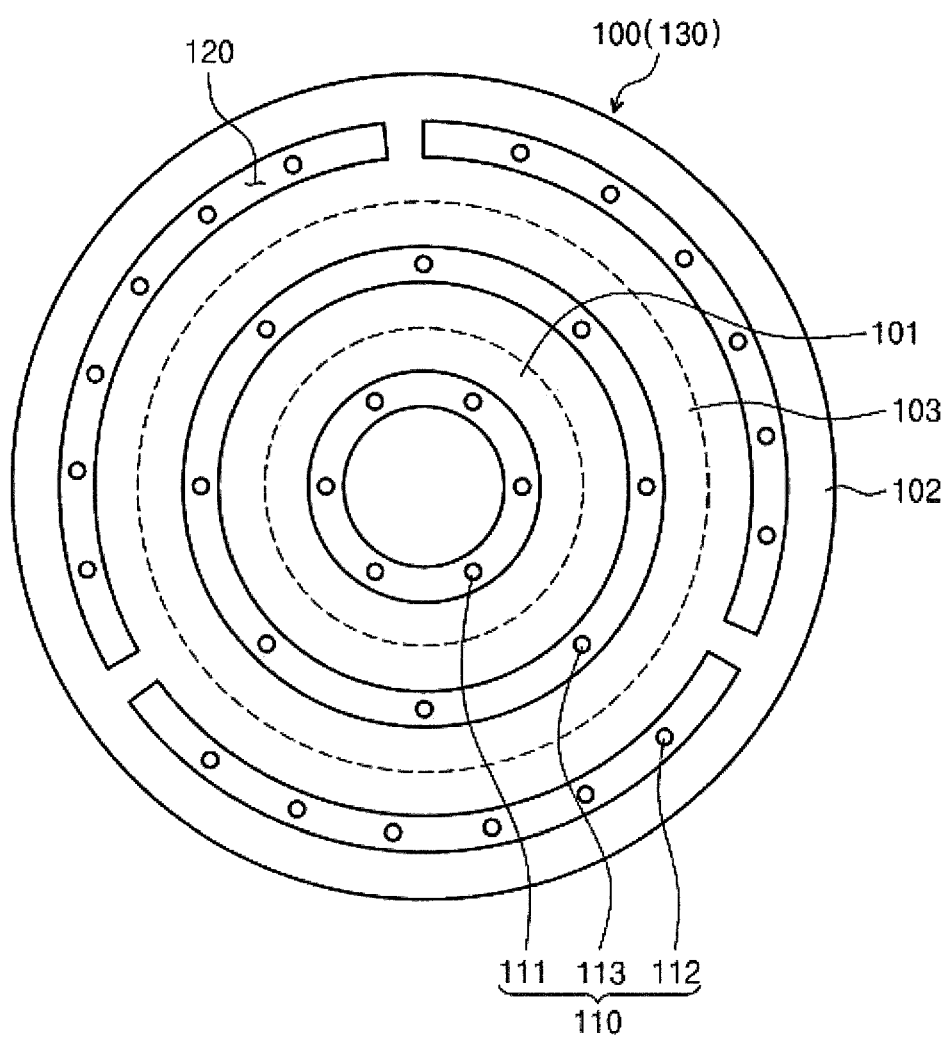
FIG. 3 is a plan view a substrate support unit of FIG. 1, when viewed from the top.

FIG. 3 is a plan view a substrate support unit 10 of FIG. 1, when viewed from the top. Referring to FIGS. 1 and 3, according to an embodiment, the absorption holes 110 includes a first absorption hole 111, a second absorption hole 112, and a third absorption hole 113. The first absorption hole 111 is formed in a central area 101 of the support plate 100. The second absorption hole 112 is formed in a peripheral area 102 of the support plate 100. The third absorption hole 113 is formed between the central area 101 and the peripheral area 102.

Grooves 120 may be formed on the upper surface of the support plate 100. The grooves 120 are recessed from the upper surface of the support plate 100 to the inside of the support plate 100. Some or all of the absorption holes 110 are located in the interiors of the grooves 120. Accordingly, the areas, in which the vacuum pressures applied to the absorption holes 110 in the interiors of the grooves influence the substrate, may be adjusted by making the shapes of the grooves 120 different. It is illustrated in the drawings that all of the absorption holes 110 are provided in the interiors of the grooves 120. However, unlike this, some of the absorption holes 110 may be formed on the upper surface of the support plate 100, which is outside the grooves 120. The grooves 120 are selectively provided if necessary. Accordingly, unlike the one described above, the grooves 120 may not be provided.

According to an embodiment, when viewed from the top, the grooves 120 may have an arc shape in which lengthwise directions of the grooves 120 are provided along a circumferential direction of the support plate 100. Unlike this, the grooves 120 may have various shapes if necessary. For example, when viewed from the top, the grooves 120 may have circular shapes that are concentric to a circumference of the support plate 100. As illustrated in FIG. 1, the grooves 120 may have different shapes according to the areas of the support plate 100. For example, some of the grooves 120 may have arc shapes, and the others of the grooves 120 may have circular shapes. Unlike this, all of the grooves 120 may have circular shapes that are concentric to each other and have different diameters. Alternatively, some of the grooves 120 may have arc shapes that are combined with each other to form a ring shape, the others of the grooves 120 may have arc shapes, radii of curvature of which are different and in which the centers of the radii of curvature are concentric to each other.

Figure 4:
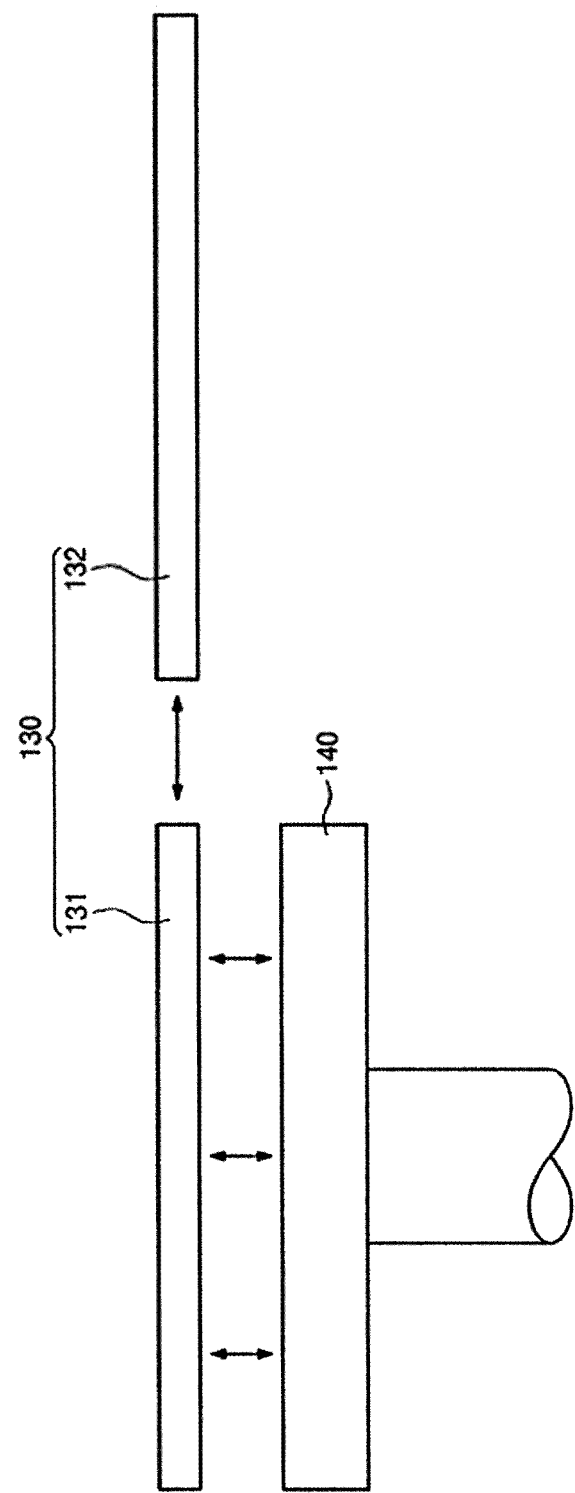
FIG. 4 is a view schematically illustrating that an upper support plate of FIG. 1 is replaced.

FIG. 4 is a view schematically illustrating that an upper support plate 130 of FIG. 1 is replaced. Referring to FIGS. 1 and 4, according to an embodiment, the support plate 100 includes an upper support plate 130 and a lower support plate 140.

The upper support plate 130 has an absorption hole 110 and a groove 120 on the upper surface thereof. The substrate S is positioned on the upper surface of the upper support plate 130. The upper support plate 130 is provided to be separable from the lower support plate 140 for replacement. According to an embodiment, a plurality of upper support plates 130 may have grooves 120 of different shapes and may be replaced by each other. Unlike this, the upper support plate 130 may be replaced by an upper support plate 130 having a groove of the same shape. For example, the upper support plate 130 includes a first upper support plate 131 and a second upper support plate 132. The first upper support plate 131 and the second upper support plate 132 are provided on the lower support plate 140 to be replaced by each other. The first upper support plate 131 and the second upper support plate 132 may be provided such that the shapes of the grooves 120 may be different when viewed from the top. Unlike this, the first upper support plate 131 and the second upper support plate 132 may be provided such that the shapes of the grooves 120 may be the same. Accordingly, the upper support plate 130 may be provided on the lower support plate 140 by selecting the upper support plate 130 having a shape of a suitable groove 120 according to a shape of a warpage with the highest percentage, in the substrates S that is a treatment target. Further, when the upper surface of the support plate 100 is damaged during the substrate treating process, the substrate support unit may be easily maintained and managed by replacing only the upper support plate 130.

The lower support plate 140 is provided below the upper support plate 130. The lower support plate 140 supports the upper support plate 130. A connection line 222, which will be described below, may be formed in the interior of the lower support plate 140 to be connected to an absorption hole 110 formed in the upper support plate 130.

Referring to FIGS. 1 and 2 again, the vacuum absorption unit 200 applies a vacuum pressure to the absorption hole 110. According to an embodiment, the vacuum absorption unit 200 includes a pressure measuring member 210, an intake unit 220, and a controller 230.

The pressure measuring member 210 measures an internal pressure of the absorption hole 110. A gap is formed between an area of the substrate S positioned on the support plate 100 and the upper surface of the support plate 100 due to a warpage, and the pressures in the absorption holes 110 increase as exterior gas is introduced into the absorption holes 110 through the gap. Accordingly, it may be determined whether a gap is formed between the substrate S positioned on the support plate 100 and the upper surface of the support plate 100 by measuring the pressures in the absorption holes 110 by using the pressure measuring members 210. According to an embodiment, the pressure measuring members 210 may be provided in connection lines 222 connected to areas of the absorption holes 110, respectively. Because the absorption holes 110 and the connection lines 222 are communicated with each other, the pressure measuring members 210 may be provided in the connection lines 222 to measure the internal pressures of the absorption holes 110. Unlike this, if necessary, the pressure measuring members 210 may be provided to be closer to the absorption holes 110 or may be separately provided for the respective absorption holes 110.

The intake unit 220 is configured to intake and discharge the gas in the absorption holes and to adjust a suction force by which the gas in the absorption holes 110 is suctioned. According to an embodiment, the intake unit 220 includes a pump 221, connection line 222, and a valve 223.

The pump 221 defines suction holes for exhausting gas to form a vacuum pressure in the absorption holes 110.

The connection lines 222 connect the pump 221 and the absorption holes 110. The gas in the absorption holes 110 is discharged by the pump 221 through the connection lines 222. According to an embodiment, the connection lines 222 include a first connection line 222a, a second connection line 222b, and a third connection line 222c.

The first connection line 222a connects the first absorption hole 111 and the pump 221. The second connection line 222b connects the second absorption hole 112 and the pump 221. The third connection line 222c connects the third absorption hole 113 and the pump 221.

The valves 223 adjust opening degrees of the connection lines 222. According to an embodiment, the valves 223 are solenoid valves. Unlike this, the valves 223 may be various valves that may adjust opening degrees of the connection lines 222. According to an embodiment, the valves 223 include a first valve 223a, a second valve 223b, and a third valve 223c.

The first valve 223a is provided in the first connection line 222a to adjust the opening degree of the first connection line 222a. The second valve 223b is provided in the second connection line 222b to adjust the opening degree of the second connection line 222b. The third valve 223c is provided in the third connection line 222c to adjust the opening degree of the third connection line 222c.

The controller 230 controls an intake unit 220 to adjust a suction force according to a pressure measured by the pressure measuring member 210. According to an embodiment, the controller 230 controls the intake unit 220 to increase a suction force for some of the absorption holes 110, the internal pressure of which is a specific value or more in a state in which the gas in the absorption hole 110 is discharged to absorb the substrate S.

According to an embodiment, the controller 230 controls the intake unit 220 to increase a suction force for one of the first absorption hole 111, the second absorption hole 112, and the third absorption hole 113, the internal pressure of which is a specific value or more. The controller 230 may control the intake unit to adjust the suction force by adjusting the opening degree of the valve 223. For example, the controller 230 may control the intake unit 220 to adjust the suction force by adjusting the opening degree of the valve 223. That is, as mentioned above, when the first absorption hole 111, the second absorption hole 112, and the third absorption hole 113 are provided, the controller 230 controls the intake unit 220 to adjust the suction force by adjusting the opening degrees of the first valve 223a, the second valve 223b, and the third valve 223c.

Hereinafter, an example in which the controller 230 controls the intake unit 220 to cope with a warpage of a substrate S will be described in more detail with reference to FIGS. 5 to 7.

Figure 5:
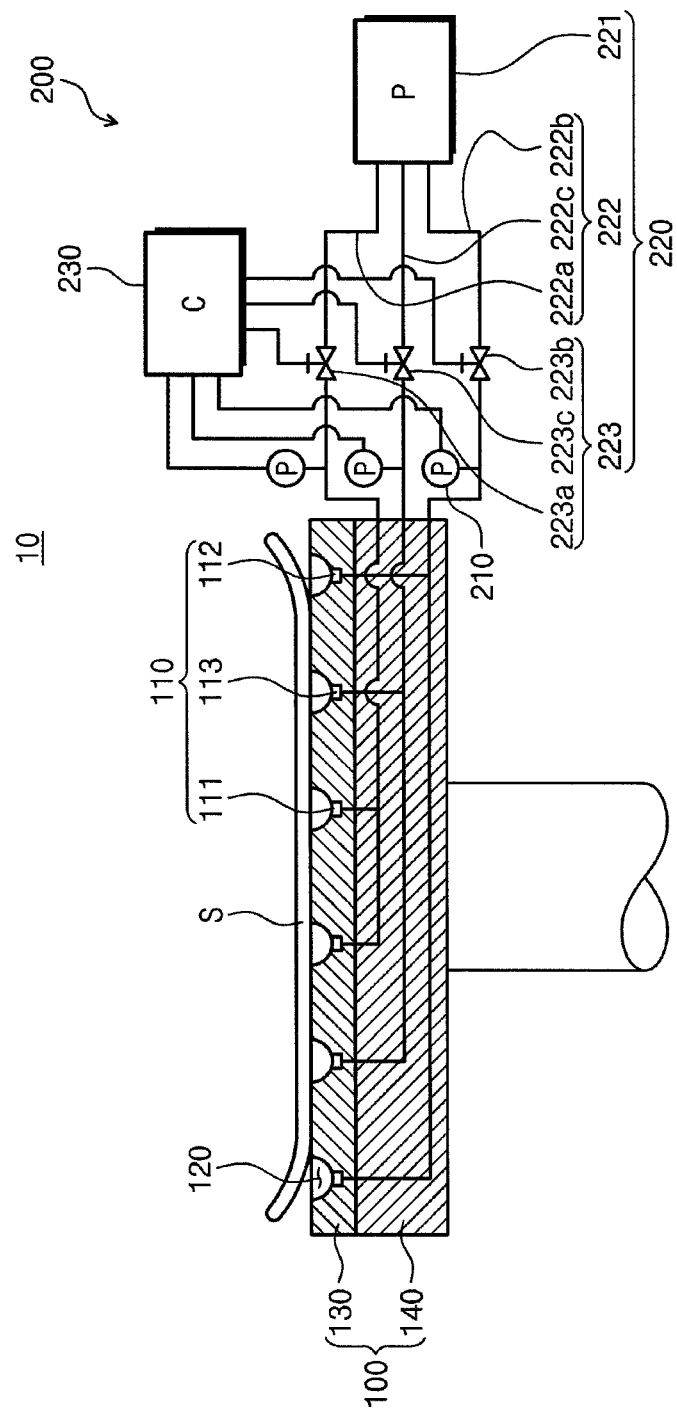
FIGS. 5 to 7 are side views of the substrate support unit of FIG. 1 according to the shape of a warpage of the provided substrate.
Figure 6:
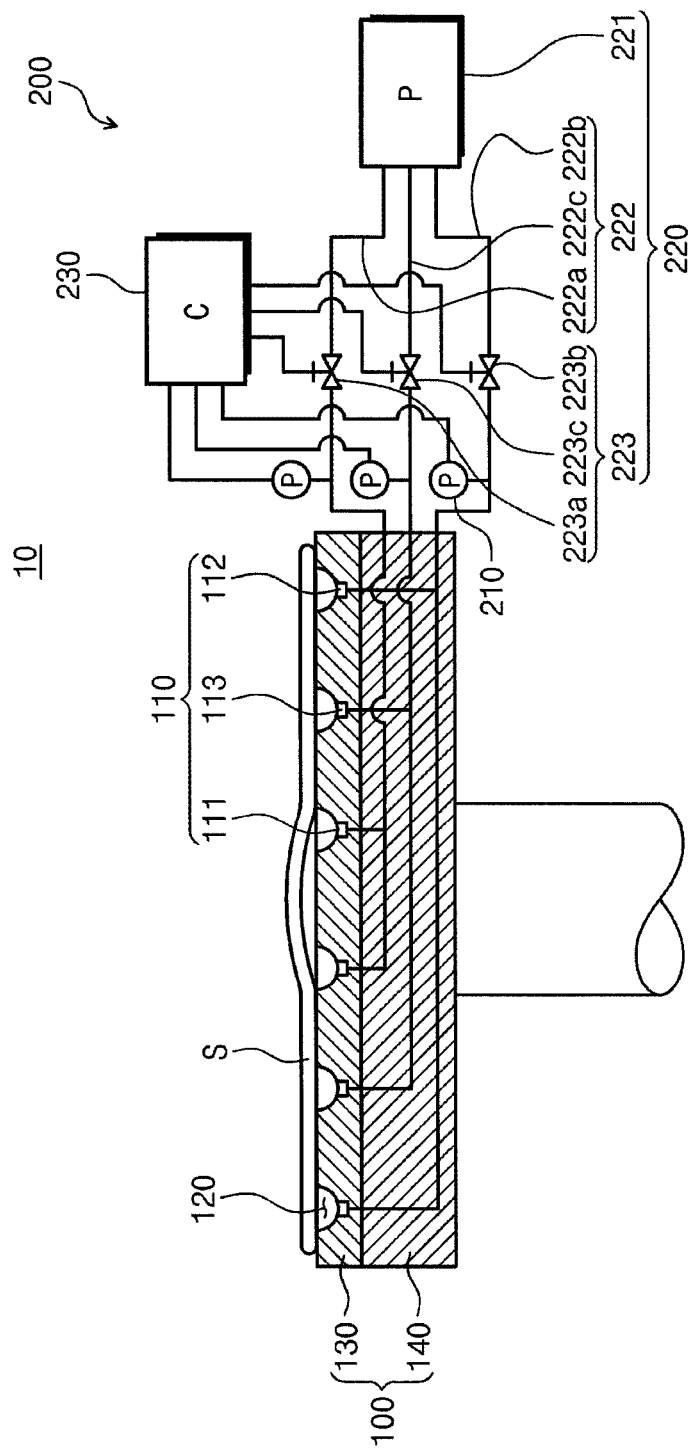
Figure 7:
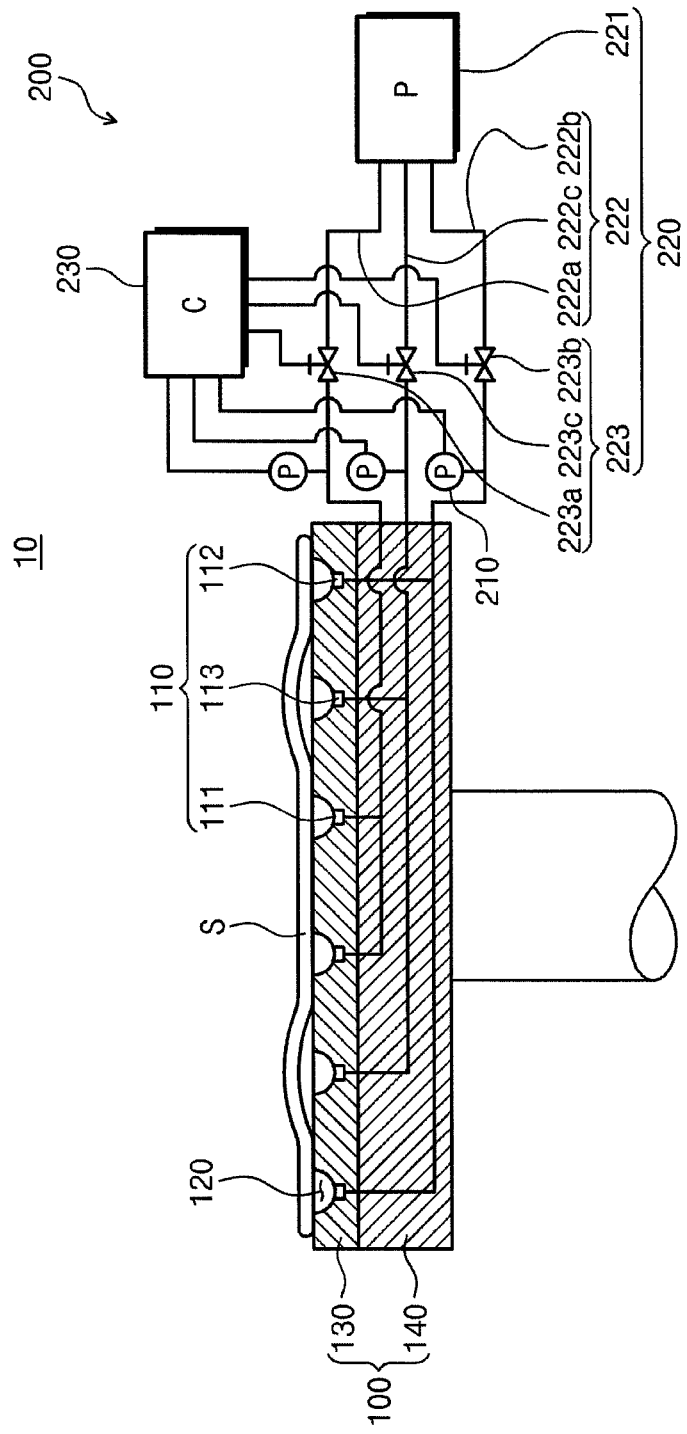

FIGS. 5 to 7 are side views of the substrate support unit 10 of FIG. 1 according to the shape of a warpage of the provided substrate S.

Referring to FIG. 5, when a substrate S, a peripheral area of which is warped upwards, is positioned on the support plate 100 or a peripheral area of a substrate S positioned on the support plate 100 is warped upwards during a process, a gap is formed between a peripheral area of the bottom surface of the substrate S and a peripheral area of the support plate 100. In this case, exterior gas is introduced into the second absorption hole 112 through the gap, and the pressure in the interior of the second absorption hole 112 increases. Accordingly, the controller 230 identifies that the pressure in the interior of the second absorption hole 112 increased by a specific value or more by the measurement value of the pressure in the interior of the second absorption hole 112 measured by the pressure measuring member 210. Thereafter, the controller 230 increases the opening degree of the second valve 223b to increase the suction force for exhausting the gas in the second absorption hole 112. Accordingly, a peripheral area of the substrate S is closely attached to a peripheral area of the support plate 100 by the increased suction force of the second absorption hole 112.

Referring to FIG. 6, when a substrate S, a central area of which is warped upwards, is positioned on the support plate 100 or a central area of a substrate S positioned on the support plate 100 is warped upwards during a process, a gap is formed between a central area of the bottom surface of the substrate S and a central area of the support plate 100. In this case, exterior gas is introduced into the first absorption hole 111 through the gap, and the pressure in the interior of the first absorption hole 111 increases. Accordingly, the controller 230 identifies that the pressure in the interior of the first absorption hole 111 increased by a specific value or more by the measurement value of the pressure in the interior of the first absorption hole 111 measured by the pressure measuring member 210. Thereafter, the controller 230 increases the opening degree of the first valve 223a to increase the suction force for exhausting the gas in the first absorption hole 111. Accordingly, a central area of the substrate S is closely attached to a central area of the support plate 100 by the increased suction force of the first absorption hole 111.

Referring to FIG. 7, when a substrate S, an area between a central area and a peripheral area of which is warped upwards, is positioned on the support plate 100 or an area between a central area and a peripheral area of a substrate S positioned on the support plate 100 is warped upwards during a process, a gap is formed between an area between a central area and a peripheral area of the bottom surface of the substrate S and an area between a central area and a peripheral area of the support plate 100. In this case, exterior gas is introduced into the third absorption hole 113 through the gap, and the pressure in the interior of the third absorption hole 113 increases. Accordingly, the controller 230 identifies that the pressure in the interior of the third absorption hole 113 increased by a specific value or more by the measurement value of the pressure in the interior of the third absorption hole 113 measured by the pressure measuring member 210. Thereafter, the controller 230 increases the opening degree of the third valve 223c to increase the suction force for exhausting the gas in the third absorption hole 113. Accordingly, an area between a central area and a peripheral area of the substrate S is closely attached to an area between a central area and a peripheral area of the support plate 100 by the increased suction force of the third absorption hole 113.

Unlike the one described above, the upper surface of the support plate 100 may be classified into various areas of various combinations that are different from the ones of FIGS. 1 to 3, the internal pressures of the absorption holes 110 located in the respective areas may be measured respectively, and the suction forces of the absorption holes 110 located in the respective areas may be adjusted according to the measured internal pressures. Although the areas of the upper surface of the support plate 100 are different from the ones of FIGS. 1 to 3 in the following examples, the configuration of measuring pressure and adjusting suction force is substantially similar to that of the vacuum absorption unit 200 of FIG. 2. Further, the method of closely attaching an upwardly warped area of the substrate by measuring pressure and adjusting suction force is substantially similar to the case of FIGS. 5 to 7.

Figure 8:
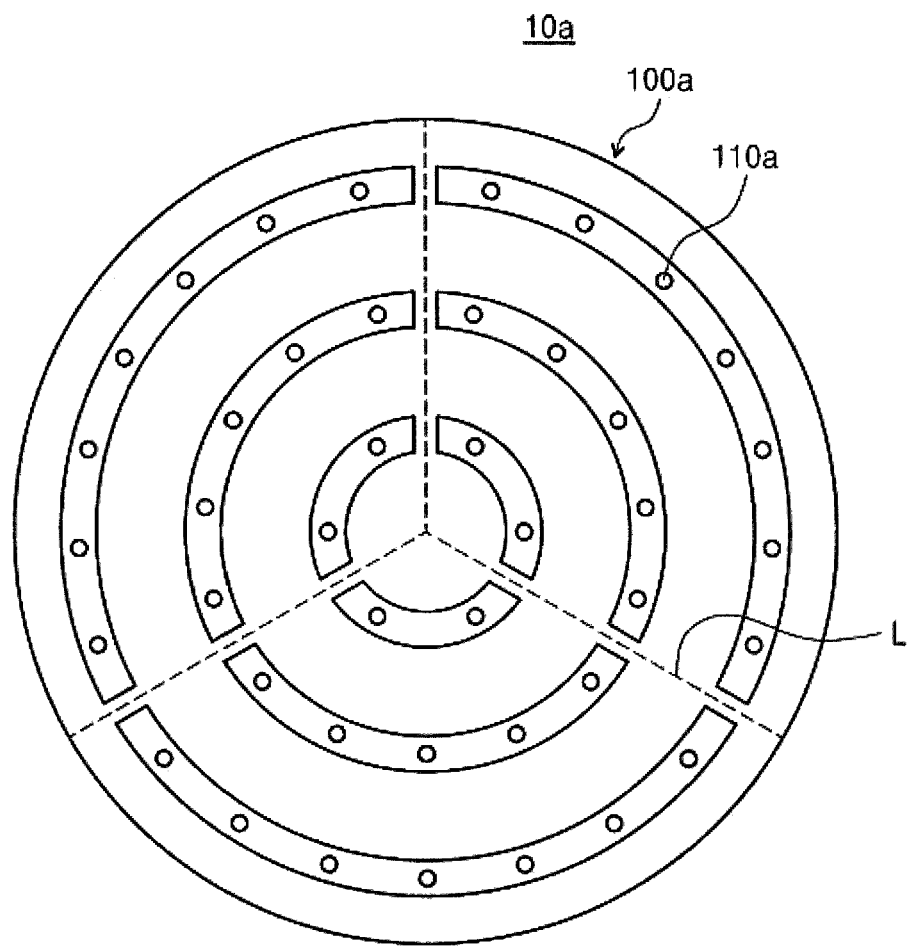
FIGS. 8 and 9 are plan views of a substrate support unit according to other embodiments.
Figure 9:
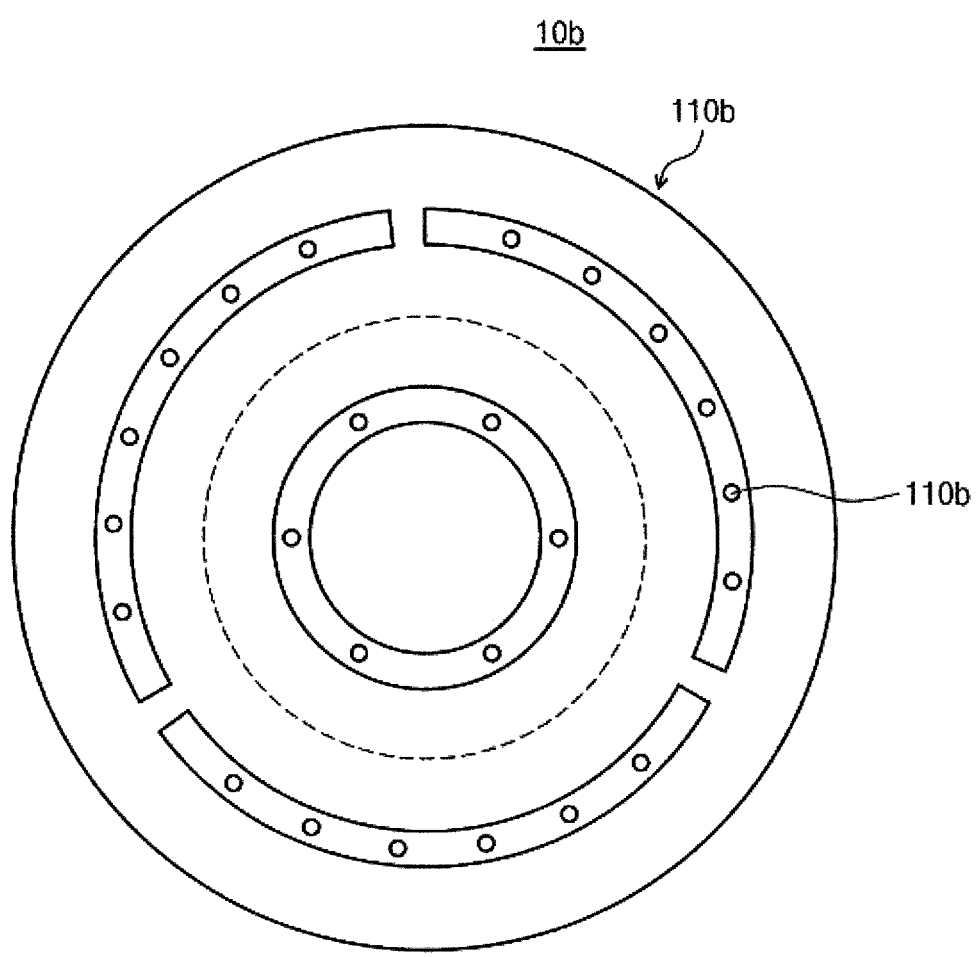

FIGS. 8 and 9 are plan views of a substrate support unit 10a and 10b according to other embodiments.

Referring to FIG. 8, the upper surface of the support plate 100a may include a plurality of areas divided by an imaginary line provided along a radial direction. In this case, the internal pressures of the absorption holes 110a located in the respective areas are measured, and the suction forces of the absorption holes 110a located in the respective areas are adjusted according to the measured internal pressures.

Referring to FIG. 9, the upper surface of the support plate 100b may include two areas of a central area and a peripheral area. In this case, the internal pressures of the absorption holes 110b located in the respective areas are measured, and the suction forces of the absorption holes 110b located in the respective areas are adjusted according to the measured internal pressures. The substrate support unit 10b of FIG. 9 is suitable for treating a wafer of a diameter that is smaller than that of the substrate support unit 10 of FIG. 1.

As mentioned above, the substrate support unit 10, 10a, and 10b may stably fix a substrate having a warpage by measuring the internal pressures of the absorption holes for areas respectively and adjusting the suction forces according to the measured internal pressures respectively. Further, because the substrate support unit 10, 10a, and 10b spread out the warped substrate, it may prevent and improve a warpage of the substrate.

The substrate support unit according to an embodiment of the inventive concept may stably fix a warped substrate.

Further, the substrate support unit according to an embodiment of the inventive concept may prevent a warpage of a substrate.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate support unit for supporting a substrate, the substrate support unit comprising:
   a support plate having a plurality of absorption holes, in which a vacuum pressure is formed, on an upper surface thereof to absorb the substrate; and
   a vacuum absorption unit configured to apply the vacuum pressure to the absorption holes,
   wherein the vacuum absorption unit includes:
      a pressure measuring member configured to measure internal pressures of the absorption holes;
      an intake unit configured to intake and discharge gas in the absorption holes and adjust a suction force for suctioning the gas in the absorption holes; and
      a controller configured to control the intake unit to adjust the suction force according to the internal pressures measured by the pressure measuring member,
   wherein the support plate includes:
      an upper support plate; and
      a lower support plate provided below the upper support plate and configured to support the upper support plate, the upper support plate being replaceable,
   wherein the upper support plate comprises:
      a central suction area having a circular groove having first absorption holes;
      a peripheral suction area having a plurality of arc-shaped grooves having second absorption holes; and
      a middle suction area having a circular groove having third absorption holes.

2. The substrate support unit of claim 1, wherein the controller controls the intake unit to increase a suction force for some of the absorption holes, an internal pressure of which is a specific value or more, in a state in which the gas in the suction hole is discharged to absorb the substrate.

3. The substrate support unit of claim 1, wherein the upper support plate includes:
   a first upper support plate and a second upper support plate that are replaceable with each other, and shapes of grooves of the first upper support plate and the second upper support plate are different when viewed from the top.

4. The substrate support unit of claim 1,
wherein the controller controls the intake unit to increase a suction force of one of the first absorption holes, the second absorption holes, and the third absorption holes, an internal pressure of which is a specific value or more.

5. The substrate support unit of claim 1, wherein the intake unit includes:
a pump configured to generate a suction force;
connection lines connecting the pump and the absorption holes; and
valves configured to adjust opening degrees of the connection lines, and
wherein the controller controls the intake unit to adjust the suction force by adjusting the opening degrees of the valves.

6. The substrate support unit of claim 5,
wherein the connection lines include:
a first connection line connecting the first absorption holes and the pump;
a second connection line connecting the second absorption holes and the pump; and
a third connection line connecting the third absorption holes and the pump,
wherein the valves include:
a first valve configured to adjust an opening degree of the first connection line;
a second valve configured to adjust an opening degree of the second connection line; and
a third valve configured to adjust an opening degree of the third connection line
wherein the controller controls the intake unit to adjust the suction force by adjusting opening degrees of the first valve, the second valve, and the third valve.

* * * * *